US011227951B2

(12) United States Patent
Tsai et al.

(10) Patent No.: US 11,227,951 B2
(45) **Date of Patent: *Jan. 18, 2022**

(54) METHOD OF FORMING SEMICONDUCTOR DEVICE

(71) Applicant: Taiwan Semiconductor Manufacturing Co., Ltd., Hsinchu (TW)

(72) Inventors: Chun-Hsiung Tsai, Hsinchu County (TW); Chien-Tai Chan, Hsinchu (TW); Ziwei Fang, Hsinchu (TW); Kei-Wei Chen, Tainan (TW); Huai-Tei Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,505

(22) Filed: May 19, 2020

(65) Prior Publication Data

US 2020/0279949 A1 Sep. 3, 2020

Related U.S. Application Data

(60) Continuation of application No. 16/112,766, filed on Aug. 26, 2018, now Pat. No. 10,665,717, which is a (Continued)

(51) Int. Cl.

*H01L 29/78* (2006.01)
*H01L 29/66* (2006.01)

(Continued)

(52) U.S. Cl.

CPC ...... *H01L 29/7848* (2013.01); *H01L 21/2236* (2013.01); *H01L 21/26513* (2013.01);

(Continued)

(58) Field of Classification Search

CPC ........... H01L 29/7848; H01L 29/66795; H01L 29/665; H01L 21/2236; H01L 21/26513;

(Continued)

(56) References Cited

U.S. PATENT DOCUMENTS 6,242,333 B1 * 6/2001 McNeil ............. H01L 21/28052 257/E21.199
8,772,109 B2 7/2014 Colinge (Continued)

FOREIGN PATENT DOCUMENTS

CN 102194697 9/2011
CN 102347351 2/2012
CN 103377948 10/2013

OTHER PUBLICATIONS

Office Action of China Counterpart Application, dated Mar. 19, 2021, pp. 1-11.

*Primary Examiner* — Shahed Ahmed
(74) *Attorney, Agent, or Firm* — JCIPRNET

(57) ABSTRACT

A FinFET device and a method of forming the same are disclosed. In accordance with some embodiments, a FinFET device includes a substrate having at least one fin, a gate stack across the at least one fin, a strained layer aside the gate stack and a silicide layer over the strained layer. The strained layer has a boron surface concentration greater than about 2E20 atom/cm$^3$ within a depth range of about 0-5 nm from a surface of the strained layer.

20 Claims, 6 Drawing Sheets

Related U.S. Application Data continuation of application No. 15/652,271, filed on Jul. 18, 2017, now Pat. No. 10,062,780, which is a division of application No. 15/009,834, filed on Jan. 29, 2016, now Pat. No. 9,722,081.

(51) Int. Cl.
*H01L 21/223* (2006.01)
*H01L 21/265* (2006.01)
*H01L 21/285* (2006.01)
*H01L 21/768* (2006.01)

(52) U.S. Cl.
CPC ...... *H01L 29/665* (2013.01); *H01L 29/66492* (2013.01); *H01L 29/66795* (2013.01); *H01L 29/785* (2013.01); *H01L 29/7834* (2013.01); *H01L 21/26506* (2013.01); *H01L 21/28518* (2013.01); *H01L 21/76897* (2013.01)

(58) Field of Classification Search
CPC ........... H01L 29/66492; H01L 29/7834; H01L 29/785; H01L 21/28518; H01L 21/76897; H01L 21/26506; H01L 29/06; H01L 29/7833–7836
See application file for complete search history.

(56) References Cited

U.S. PATENT DOCUMENTS

| | | | | |
|---|---|---|---|---|
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 2007/0020827 | A1* | 1/2007 | Buh | H01L 29/42392 438/157 |
| 2010/0041218 | A1* | 2/2010 | Hatem | A61P 31/04 438/513 |
| 2013/0316535 | A1* | 11/2013 | Shin | H01L 21/28518 438/682 |
| 2014/0151762 | A1* | 6/2014 | Wang | H01L 29/66477 257/288 |
| 2014/0154876 | A1* | 6/2014 | Tsai | H01L 21/26593 438/510 |
| 2015/0115335 | A1* | 4/2015 | Wang | H01L 21/28518 257/288 |
| 2015/0372142 | A1* | 12/2015 | Kuang | H01L 29/165 257/192 |

* cited by examiner

METHOD OF FORMING SEMICONDUCTOR DEVICE

CROSS-REFERENCE TO RELATED APPLICATION

This is a continuation application of and claims the priority benefit of U.S. application Ser. No. 16/112,766, filed on Aug. 26, 2018. The prior U.S. application Ser. No. 16/112,766 is a continuation application of and claims the priority benefit of U.S. application Ser. No. 15/652,271, filed on Jul. 18, 2017. The prior U.S. application Ser. No. 15/652,271 is a divisional application of and claims the priority benefit of U.S. application Ser. No. 15/009,834, filed on Jan. 29, 2016, U.S. Pat. No. 9,722,081 issued on Aug. 1, 2017. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
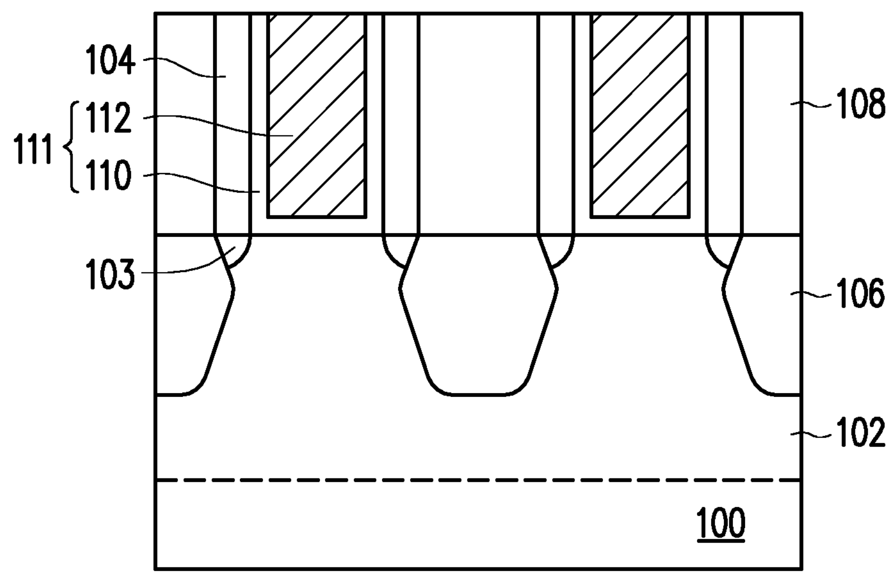
FIG. 1A to FIG. 1F are schematic cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are schematic cross-sectional views of a method of forming a FinFET device in accordance with some embodiments.

Referring to FIG. 1A, a substrate 100 with one or more fins 102 is provided. In some embodiments, the substrate 100 includes a silicon-containing substrate, a silicon-on-insulator (SOI) substrate, or a substrate formed of other suitable semiconductor materials. In some embodiments, the substrate 100 may have doped regions therein configured for a P-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

In some embodiments, the substrate 100 has at least two gate stacks 111 formed thereon, spacers 104 formed on the sidewalls of the gate stacks 111, strained layers 106 formed therein, and a first dielectric layer 108 formed aside the gate stacks 111 and over the strained layers 106.

In some embodiments, the method of forming the intermediate structure of FIG. 1A includes forming two dummy gate stacks across the fins 102, forming spacers 104 on the sidewalls of the dummy gate stacks, forming strained layers 106 at two sides of each fin 102, forming a first dielectric layer 108 aside the dummy gate stacks and over the strained layers 106, and replacing the dummy gate stacks with gate stacks 111.

In some embodiments, the dummy gate stacks includes a silicon-containing material, such as polysilicon, amorphous silicon or a combination thereof. In some embodiments, the dummy gate stacks extend in a direction different from (e.g., perpendicular to) the extending direction of the fins 102. In some embodiments, the method of forming the dummy gate stacks includes forming a stacked layer on the substrate 100 and patterning the stacked layer with photolithography and etching processes.

In some embodiments, the spacers 104 include a nitrogen-containing dielectric material, a carbon-containing dielectric material or both, and the spacers 104 have a dielectric constant less than about 10, or even less than about 5. In some embodiments, the spacers 104 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 104 includes forming a spacer material layer on the substrate 100, and partially removing the spacer material layer by an anisotropic etching process.

In some embodiments, two lightly doped regions 103 are formed in each fin 102 beside each of the dummy gate stacks prior to the formation of the spacers 104. In some embodiments, the lightly doped regions 103 includes a P-type dopant such as boron. In some embodiments, the lightly doped regions 103 can be referred to as lightly doped source/drain (LDD) regions.

In some embodiments, two strained layers 106 are formed beside each of the dummy gate stacks, and one of the strained layers 106 is between the adjacent dummy gate stacks. In some embodiments, the strained layers 106 include silicon germanium (SiGe) for a P-type FinFET device. In some embodiments, the strained layers 106 may be optionally implanted with a P-type dopant such as boron. The method of forming the strained layers 106 includes forming recesses in the fins 102. In some embodiments, the recesses have a middle-wide profile. The strained layers 106 are formed by an in-situ boron-doped epitaxy process from the recesses. Benefits of such boron-doped epitaxy process are limited because it only produces a low concentration surface profile. In other words, the beam line implant cannot deliver a high surface concentration dopant profile. In some embodiments, the strained layers 106 can be referred to as source/drain regions. In some embodiments, the strained layers 106 can be formed in a crystalline state. Besides, the tops of the strained layers 106 can be as high as or higher than the bottoms of the spacers 104.

In some embodiments, the first dielectric layer 108 includes nitride such as silicon nitride, oxide such as silicon oxide, phosphosilicate glass (PSG), borosilicate glass (BSG), boron-doped phosphosilicate glass (BPSG), a combination thereof or the like, and is formed by a suitable deposition technique such as spin-coating, CVD, flowable CVD, PECVD, ALD, a combination thereof or the like. In some embodiments, the top surface of the first dielectric layer 108 is substantially level with the top surfaces of the dummy gate stacks. In some embodiments, a contact etch stop layer (CESL) is formed after the step of forming the strained layers 106 and before the step of forming the first dielectric layer 108, and the CESL includes SiN, SiC or the like.

In some embodiments, the dummy gate stacks are replaced with gate stacks 111. In some embodiments, the dummy gate stacks are removed to form gate trenches in the first dielectric layer 108, and the gate stacks 111 are then formed in the gate trenches. In some embodiments, the method of forming the gate stacks 111 includes forming a stacked layer with CVD, PVD, plating, or a suitable process, and then performing a CMP process to remove the stacked layer outside of the gate trenches.

In some embodiments, each of the gate stacks 111 includes a gate dielectric layer 110 and a gate 112 (or called "replacement gate") on the gate dielectric layer 110. In some embodiments, the gate stacks 111 extend in a direction different from (e.g., perpendicular to) the extending direction of the fins 102. In some embodiments, each of the gate dielectric layers 110 surrounds the sidewall and bottom of the corresponding gate 112 and on the top and sidewall of each fin 102, as shown in FIG. 1A. In some embodiments, an interfacial layer such as a silicon oxide layer is formed between the gate dielectric layer 110 and each fin 102.

In some embodiments, each of the gate dielectric layers 110 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2Os$, $Y_2O_3$, STO, BTO, BaZrO, HfZrO, HfLaO, HfTaO, HfTiO, a combination thereof, or a suitable material. In alternative embodiments, the gate dielectric layer 110 can optionally include a silicate such as HfSiO, LaSiO, AlSiO, a combination thereof, or a suitable material.

In some embodiments, each of the gates 112 includes a metal material suitable for forming a metal gate or portion thereof. In some embodiments, each of the gates 112 includes a work function metal layer and a fill metal layer on the work function metal layer. In some embodiments, the work function metal layer is a P-type work function metal layer to provide a gate electrode that properly performs in a P-type FinFET device. The P-type work function metal layer includes TiN, WN, TaN, conductive metal oxide, and/or a suitable material. The fill metal layer includes copper (Cu), aluminum (Al), tungsten (W), or a suitable material. In some embodiments, each of the gates 112 can further include a liner layer, an interface layer, a seed layer, an adhesion layer, a barrier layer, a combination thereof or the like.

Figure 1B:
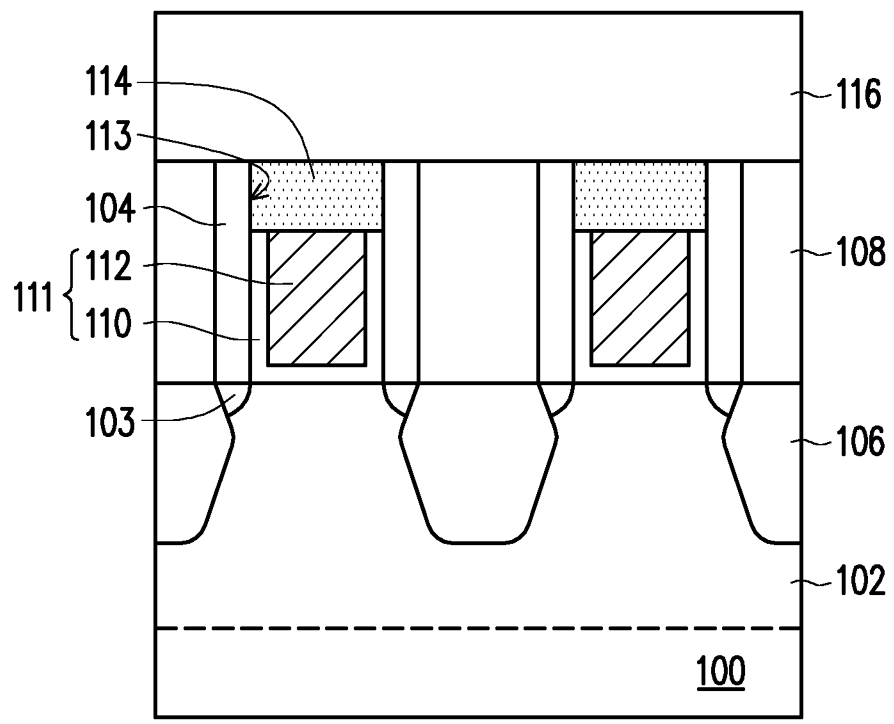

Referring to FIG. 1B, upper portions of the gate stacks 111 are removed to form recesses 113 exposing the gates 112. Specifically, portions of the gates 112 and portions of the gate dielectric layers 110 are removed by an etching back process, and the remaining gates 112 and the gate dielectric layers 110 are exposed by the recesses 113. In some embodiments, one of the recesses 113 is between two adjacent spacers 104. Thereafter, cap patterns 114 are formed in the recesses 113 covering the gates 112. In some embodiments, the cap patterns 114 are configured to protect the gates 112 from being damaged during the following contact hole defining step. In some embodiments, a cap layer is formed on the substrate 100 filling the recesses 113. The cap layer includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside of the recesses 113.

Thereafter, a second dielectric layer 116 is formed over the cap patterns 114 and the first dielectric layer 108. In some embodiments, the second dielectric layer 116 includes a material the same as that of the first dielectric layer 108. In alternative embodiments, the second dielectric layer 116 and the first dielectric layer 108 are made by different materials. In some embodiments, the second dielectric layer 116 includes nitride such as silicon nitride, oxide such as silicon oxide, PSG, BSG, BPSG, a combination thereof or the like, and is formed by a suitable deposition technique such as spin-coating, CVD, flowable CVD, PECVD, ALD, a combination thereof or the like.

Figure 1C:
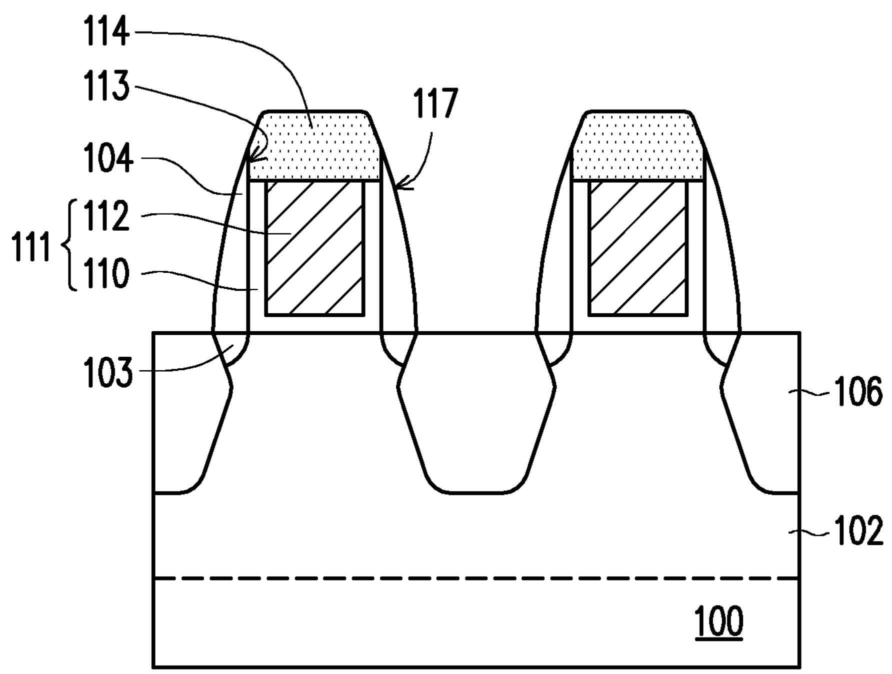

Referring to FIG. 1C, the second dielectric layer 116 and the first dielectric layer 108 are patterned or partially removed to form openings 117 (or called "contact holes") exposing the strained layers 106, respectively. In some embodiments, a mask layer such as a photoresist layer is formed on the second dielectric layer 116, covering the non-target area and exposing the target area. In some embodiments, the mask layer covers an N-type FinFET device area and exposes the intended locations of the subsequently formed contact holes in a P-type FinFET device area. Thereafter, an etching process is performed by using the mask layer as a mask. In some embodiments, the etching process is referred to as a self-aligned contact (SAC) etching process by using the spacers 104 and the cap patterns 114 as self-aligned masks. In some embodiments, portions of the spacers 104 and top corners of cap patterns 114 are removed during the etching process, and the openings 117 are formed with tilted sidewalls, as shown in FIG. 1C. In alternative embodiments, the openings 117 can be formed with substantially vertical sidewalls. In some embodiments, the aspect ratio of the openings 117 is greater than about 5 or even greater than about 10. Besides, the openings 117 can be formed as plugs, pillars, strips, walls or any suitable shapes as needed.

Figure 1D:
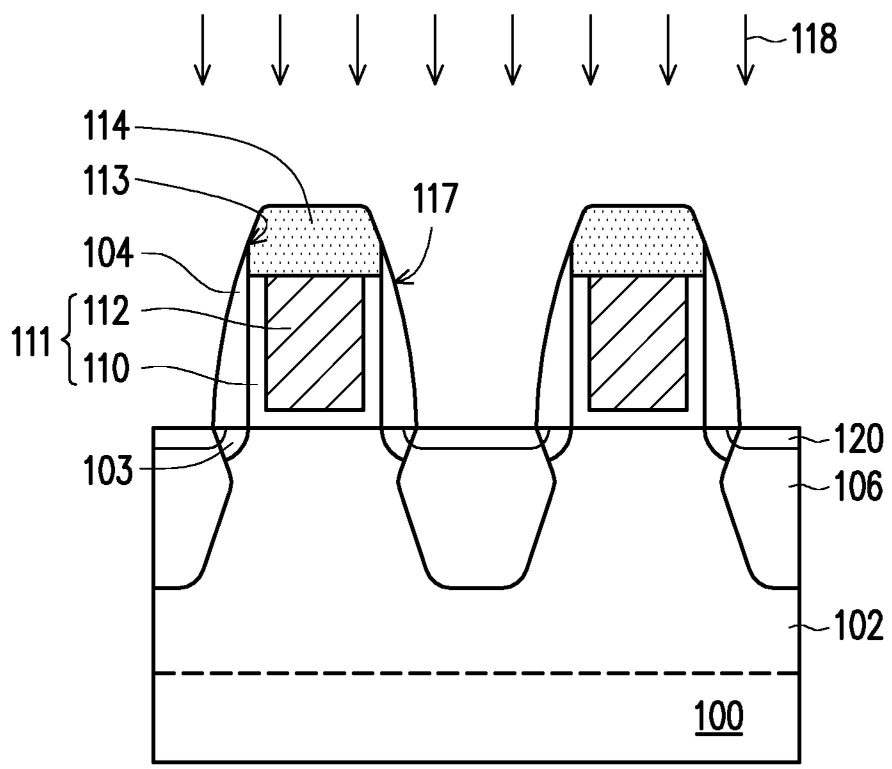

Referring to FIG. 1D, a doping step 118 is performed to the strained layers 106 to form shallow doped regions 120 therein, and the shallow doped regions 120 and the strained layers 106 have the same conductivity type. In some embodiments, the doping step 118 is a single step. In alternative embodiments, the doping step 118 includes multiple sub-steps. In some embodiments, the shallow doped regions 120 and the strained layers 106 include a P-type dopant such as boron. That is, the doping step 118 is a boron doping step. In some embodiments, the shallow doped regions 120 have a depth of less than about 20 nm, less than about 15 nm, less than about 10 nm or even less than 8 nm.

In some embodiments, the doping step 118 causes a surface amorphization in each of the strained layers 106. In some embodiments, the shallow doped regions 120 are formed in a fully amorphous state. In such case, the doping step 118 functions as a pre-amorphous implant (PAI) step, so the conventional PAI step with germanium (Ge) for confining the silicide formation to the amorphous regions is not necessary. In other words, the doping step 118 of the disclosure replaces the conventional germanium PAI step.

In alternative embodiments, the shallow doped regions 120 are formed in a partially amorphous state; that is, the shallow doped regions 120 are formed in a mixed crystalline-amorphous state and having some degree of structural order. In such case, a PAI step can be performed before or after the doping step 118 to fully amorphize the shallow doped regions 120. Such PAI step can be implemented with germanium (Ge), xenon (Xe) or the like.

In some embodiments, the doping step 118 is an ion implantation step. In some embodiments, the ion implantation step is performed at an energy of about 1 KeV to 2 KeV and a dose of about 2E15 atom/$cm^2$ to 6E15 atom/$cm^2$. Upon the ion implantation step, the strained layers 106 or the shallow doped regions 120 have a boron surface concentration greater than about 2E20 atom/$cm^3$ within a depth range of about 0-5 nm from surfaces of the strained layers 106. In some embodiments, the boron surface concentration of the strained layers 106 or the shallow doped regions 120 is in a range from about 2E20 to 1E21 atom/$cm^3$. For example, the boron surface concentration of the strained layers 106 or the shallow doped regions 120 can be, for example but is not limited to, about 2E20, 3E20, 4E20, 5E20, 6E20, 7E20, 8E20, 9E20, 1E21 atom/$cm^3$, including any range between any two of the preceding values.

In addition to the surface amorphization, the ion implantation step increases the surface concentration of the strained layers 106 and therefore reduces the contact resistance (Rcsd). Besides, the ion implantation step causes a tailing doping profile. The tailing doping profile laterally extends toward the adjacent lightly doped regions 103 and helps to reduce the parasitic resistance (Rp) and therefore suppress the short channel effect. The tailing doping profile vertically extends toward the bottom of the corresponding strained layer 106 and helps to modulate the threshold voltage (Vt) of the device.

In alternative embodiments, the doping step 118 is a plasma doping step. In some embodiments, the plasma doping step is performed at an energy of about 1 KeV to 2 KeV and a dose of about 2E15 atom/$cm^2$ to 6E15 atom/$cm^2$. In some embodiments, the plasma doping process is performed by using a boron-containing gas including diborane ($B_2H_6$) and a dilution gas including hydrogen ($H_2$), argon (Ar), helium (He) or a combination thereof. In some embodiments, the plasma doping process is performed by using about 0.1%-10% of the boron-containing gas and about 90%-99.9% of the dilution gas. For example, the plasma doping process is performed by using about 0.1%-5% or 0.1%-2% (e.g., about 0.5%) of $B_2H_6$ and about 95%-99.9% or 98%-99.9% (e.g., about 95.5%) of helium.

Upon the plasma doping step, the strained layers 106 or the shallow doped regions 120 have a boron surface concentration greater than about 2E20 atom/$cm^3$ within a depth range of about 0-5 nm from surfaces of the strained layers 106. In some embodiments, the boron surface concentration of the strained layers 106 or the shallow doped regions 120 is in a range from about 1E21 to 5E21 atom/$cm^3$. For example, the boron surface concentration of the strained layers 106 or the shallow doped regions 120 can be, for example but is not limited to, about 1E21, 2E21, 3E21, 4E21, 5E21 atom/$cm^3$, including any range between any two of the preceding values.

In addition to the surface amorphization, the plasma doping step increases the surface concentration of the strained layers 106 and therefore reduces the contact resistance (Rcsd). Specifically, the plasma doping step causes a highly abrupt doping profile in an ultra-shallow region near the surface, so the contact resistance (Rcsd) can be significantly reduced.

Figure 1E:
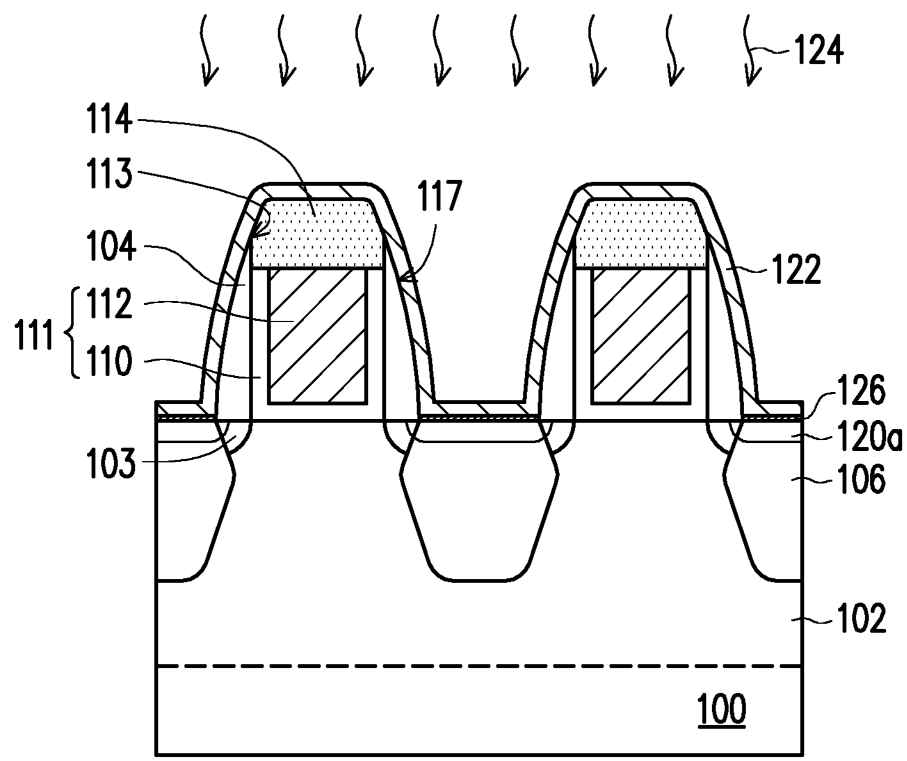

Referring to FIG. 1E, a metal layer 122 is formed on the strained layers 106 after the boron doping step 118. In some embodiments, the metal layer 122 includes nickel (Ni), cobalt (Co), tungsten (W), tantalum (Ta), titanium (Ti), titanium nitride (TiN), a combination thereof or the like, and is formed by a suitable deposition, such as CVD, PVD or the like. In some embodiments, the metal layer 122 is a multi-layer structure of Ti/TiN.

Thereafter, an annealing step 124 is performed to the substrate 100, and silicide layers 126 are therefore formed on the strained layers 106 respectively. In some embodiments, a salicide (self-aligned silicide) process is performed, so a metal material formed next to a silicon material is reacted to form a silicide material. The silicide material includes nickel silicide (NiSi), cobalt silicide (CoSi), tungsten silicide (WSi), tantalum silicide (TaSi), titanium silicide (TiSi), a combination thereof or the like. In some embodiments, the silicide layers 126 are formed in contact with the strained layers 106 or the shallow doped regions 120.

In some embodiments, the shallow doped regions 120 are amorphous and therefore do not exacerbate the defects, so the silicide layers 126 are contained within the amorphous regions, and the device performance is accordingly improved.

In some embodiments, the annealing step 124 is performed at a temperature of about 850° C. to 1,000° C. Upon the annealing step 124, the shallow doped regions 120 in an amorphous state are transformed into shallow doped regions 120*a* in a crystalline state. Besides, the annealing step 124 recovers the defects caused by the doping step 118 and an optional PAI step before or after the doping step 118. The un-reacted metal of the metal layer 122 is then removed or etched away.

Figure 1F:
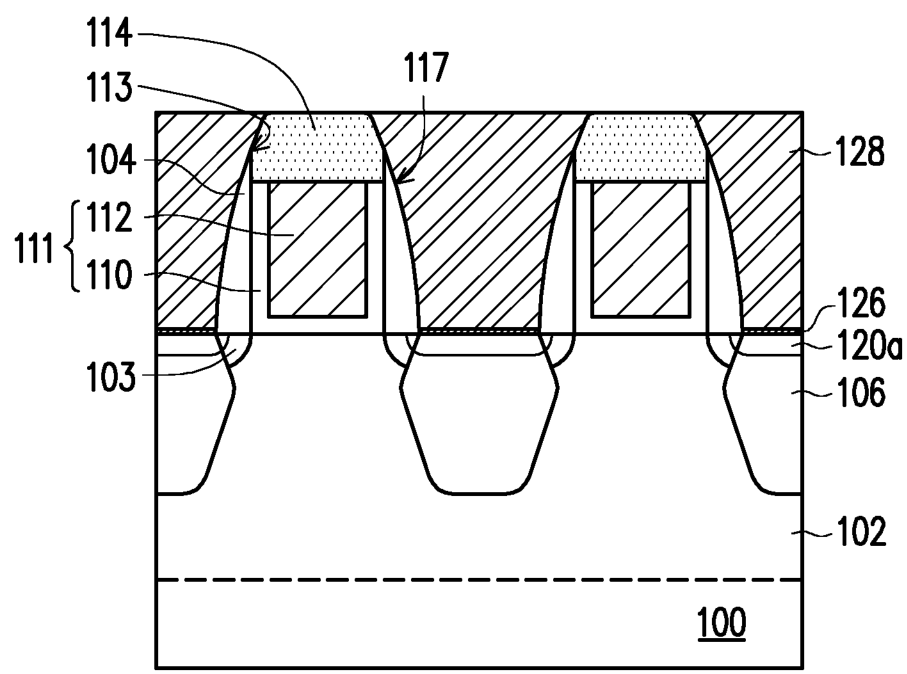

Referring to FIG. 1F, connectors 128 are formed in the openings 117. In some embodiments, the connectors 128 are intended to represent any type of conductive materials and structures that are electrically connected to the strained layers 106. In some embodiments, the connectors 128 include metal, such as W, Cu, an alloy thereof or any metal material with suitable resistance and gap-fill capability. In some embodiments, after the silicide layers 126 are formed, a metal layer is formed on the substrate 100 filling in the openings 117. The metal layer is formed by sputtering, CVD, electrochemical plating (ECP), a combination thereof or the like. A planarization step such as CMP is then performed to remove a portion of the metal layer until tops of the cap patterns 114 are exposed. In some embodiments, the tops of the connectors 128 are substantially coplanar with the tops of the cap patterns 114. A FinFET device of the disclosure is thus completed.

The above embodiments in which each of the gate dielectric layers, the gates, the spacers, the cap patterns, the first dielectric layer, the second dielectric layer, and the connectors is a single layer are provided for illustration purposes, and are not construed as limiting the present disclosure. In some embodiments, at least one of these described elements can be a multi-layer structure as needed.

The above-mentioned process steps in FIG. 1A-1F can be concisely illustrated with reference to the flow charts of FIG. 2 to FIG. 4.

At step S200, a substrate 100 is provided with a gate stack 111 formed thereon, a strained layer 106 formed therein and a first dielectric layer 108 formed aside the gate stack 111 and over the strained layer 106, as shown in FIG. 1A. In some embodiments, a cap pattern 114 is provided above the gate stack 111 and between spacers 104 on the sidewalls of the gate stack 111, and a second dielectric layer 116 is formed over the cap pattern 114 and the first dielectric layer 108, as shown in FIG. 1B.

At step S202, an opening 117 is formed through the first dielectric layer 108 and therefore exposes the strained layer 106, as shown in FIG. 1C. In some embodiments, the opening 117 is formed with a self-aligned contact (SAC) etching process.

At step S204, a doping step 118 is performed to the strained layer 106, as shown in FIG. 1D. In some embodiments, the doping step 118 causes a surface amorphization in the strained layer 106. Specifically, the doping step 118 forms a shallow amorphous region (e.g., shallow doped region 120) in the strained layer 106. In some embodiments, the shallow doped region 120 has a high surface concentration greater than about 2E20 atom/cm$^3$ within a depth range of about 0-5 nm from a top surface thereof. Besides, the shallow doped region 120 and the strained layer 106 have the same conductivity type. In some embodiments, the doping step 118 is an ion implantation process. In alternative embodiments, the doping step 118 is a plasma doping process. In some embodiments, the doping step 118 is a boron doping step performed at an energy of about 1 KeV to 2 KeV and a dose of about 2E15 atom/cm$^2$ to 6E15 atom/cm$^2$.

At step S206, a silicide layer 126 is formed on the strained layer 106 after the doping step 118, as shown in FIG. 1E. In some embodiments, a metal layer 122 is formed on the strained layer 106 immediately after the boron doping step 118, and an annealing step 124 is then formed to the substrate 100. In some embodiments, the annealing step is performed at a temperature of about 850° C. to 1,000° C. In some embodiments, during the step of forming the silicide layer 126, the amorphous shallow region (e.g., shallow doped region 120) is transformed into a crystalline shallow region (e.g., shallow doped region 120*a*).

At step 208, a connector 128 is formed in the opening 117, as shown in FIG. 1F. In some embodiments, the connector 128 is electrically connected to the strained layer 106 or the silicide layer 126. In some embodiments, the shallow doped region 120*a* in the surface portion of the strained layer 106 is provided with such a high dopant concentration, so the contact resistance can be effectively reduced.

Figure 2:
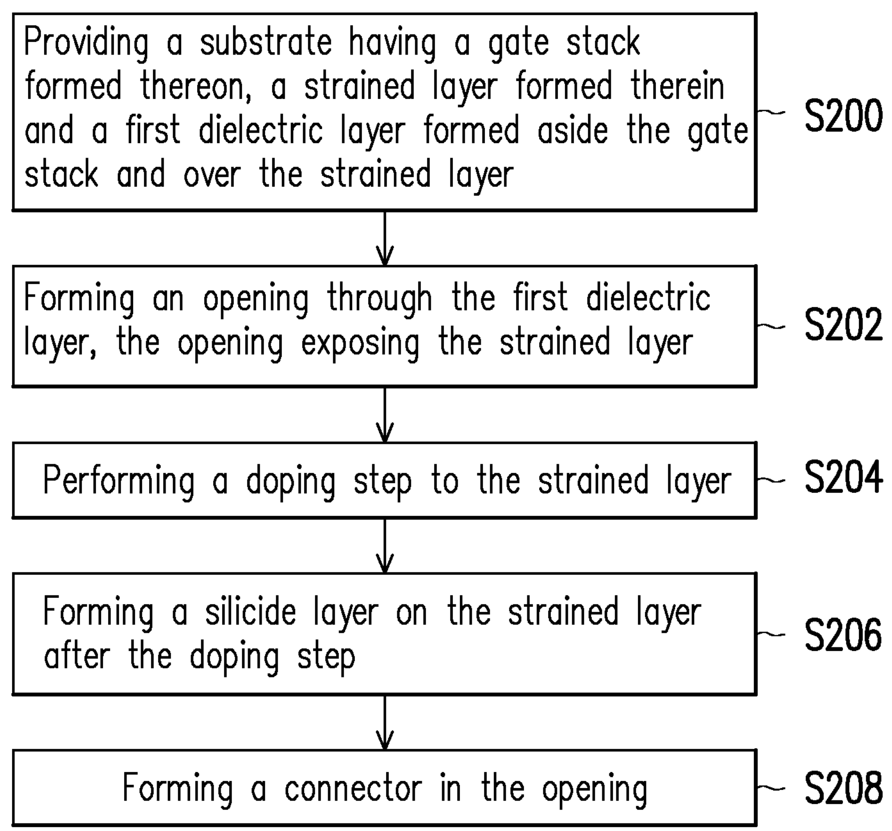
FIG. 2 is a flow chart of a method of forming a FinFET device in accordance with some embodiments.
Figure 3:
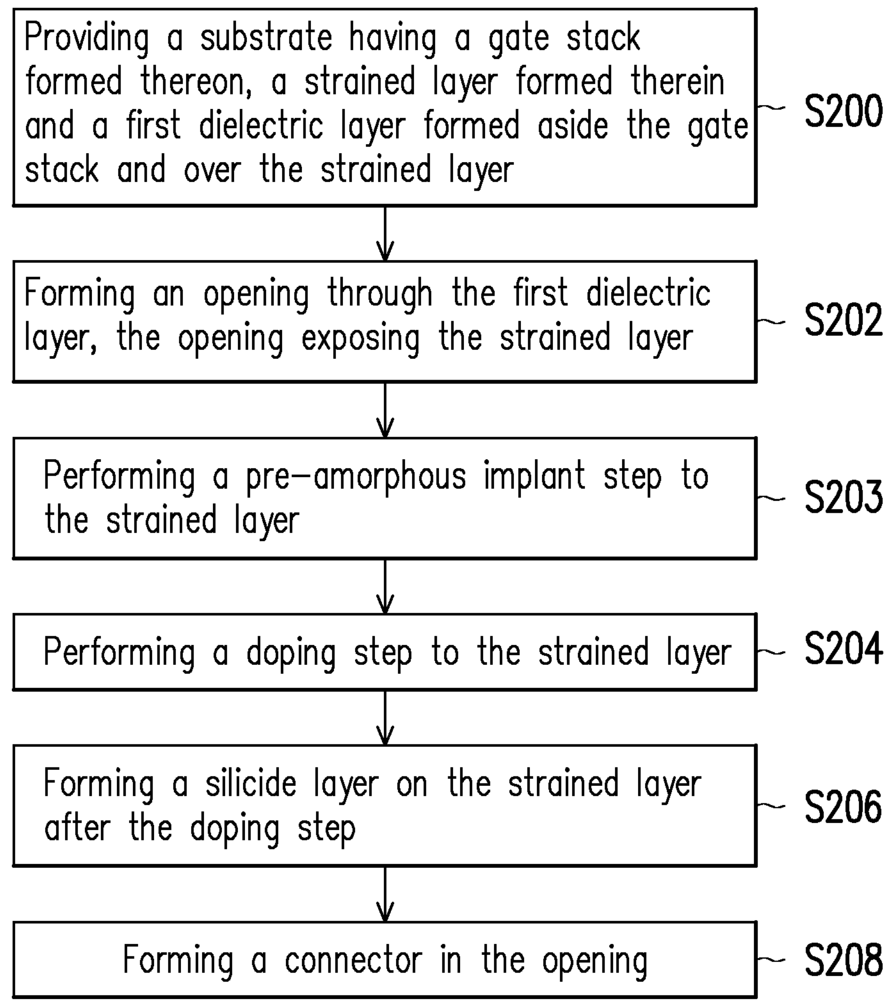
FIG. 3 is a flow chart of a method of forming a FinFET device in accordance with alternative embodiments.

The process flow of FIG. 3 is similar to that of FIG. 2, and the difference lies in that the process flow of FIG. 3 further includes a pre-amorphous implant step (step S203) before the doping step 118 (step S204).

Figure 4:
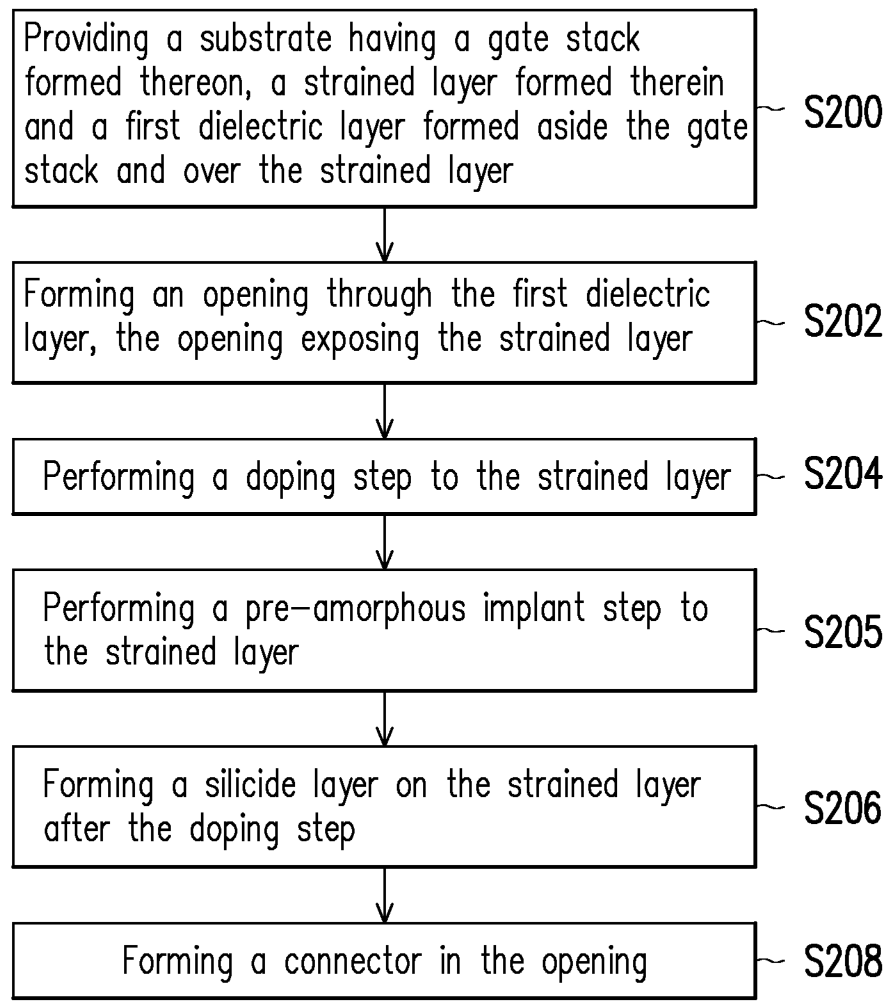
FIG. 4 is a flow chart of a method of forming a FinFET device in accordance with yet alternative embodiments.

The process flow of FIG. 4 is similar to that of FIG. 2, and the difference lies in that the process flow of FIG. 4 further includes a pre-amorphous implant step (step S205) after the doping step 118 (step S204).

The structure of the FinFET device of the disclosure is described with reference to FIG. 1F.

In some embodiments, a FinFET device includes a substrate 100, a gate stack 111, a strained layer 106, and a silicide layer 126. The substrate 100 has at least one fin 102. The gate stack 111 is across the at least one fin 102. The strained layer 106 is aside the gate stack 111 and has a boron surface concentration greater than about 2E20 atom/cm$^3$ within a depth range of about 0-5 nm from a surface of the strained layer 106. The silicide layer 126 is over and in contact with the strained layer 106.

In some embodiments, when the boron surface concentration of the strained layer 106 is provided by an ion implantation process, the boron surface concentration of the strained layer 106 is in a range from about 2E20 to 1E21 atom/cm$^3$. In alternative embodiments, when the boron surface concentration of the strained layer 106 is provided by a plasma doping process, the boron surface concentration of the strained layer 106 is in a range from about 1E21 to 5E21 atom/cm$^3$.

The described embodiments in which a P-type FinFET device and a method of forming the same are provided for illustration purposes, and are not construed as limiting the present disclosure. In some embodiments, the described method can be implemented to form an N-type FinFET device. Specifically, the phosphor doping step replaces the boron doping step, and the phosphor doping step is performed at an energy of about 2 KeV to 5 KeV and a dose of about 2E15 atom/cm$^2$ to 6E15 atom/cm$^2$, for example. It is appreciated by people having the ordinary skill in the art that the conductivity types of the described doped regions/layers can be changed and configured for an N-type FinFET device upon the process requirements.

In the above-mentioned embodiments, a "gate last" process is implemented to form a FinFET device. However, another process such as a "gate first" process or another type of device (e.g., planar device) can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

In view of the above, at least one boron doping process is performed to the device after a contact hole definition and before a silicide deposition. Such boron doping process provides a high surface dopant concentration that is effective in reducing the contact resistance and therefore boosting the device performance.

In some embodiments, the boron doping process of the disclosure replaces the conventional PAI step. The conventional PAI step usually degrades the source/drain conductivity and therefore reduces the contact resistance. However, the boron doping process of the disclosure does not have such issues. Instead, the boron doping process of the disclosure provides a high surface concentration so as to effectively reduce the contact resistance.

In accordance with some embodiments of the present disclosure, a FinFET device includes a substrate, a gate stack, a stained layer and a silicide layer. The substrate has at least one fin. The gate stack is across the at least one fin. The strained layer is aside the gate stack and has a boron surface concentration greater than about 2E20 atom/cm$^3$ within a depth range of about 0-5 nm from a surface of the strained layer. The silicide layer over the strained layer.

In accordance with alternative embodiments of the present disclosure, a FinFET device includes a substrate, a gate stack, a stained layer and a shallow doped region. The substrate has at least one fin. The gate stack is across the at least one fin. The strained layer is aside the gate stack. The shallow doped region is located in a surface portion of strained layer. A concentration of the shallow doped region is higher than a concentration of the strained layer, and the shallow doped region and the strain layer have a same conductivity type dopant.

In accordance with yet alternative embodiments of the present disclosure, a FinFET device includes a substrate, a metal gate stack, a source and drain region, a lightly doped region, and a shallow doped region. The substrate has at least one fin. The metal gate stack is across the at least one fin. The source and drain region is aside the metal gate stack. The lightly doped region is located between the source and drain region and the metal gate stack. The shallow doped region is in surface portions of the source and drain region and the lightly doped region. The source and drain region, the shallow doped region and the lightly doped region have a same conductivity type dopant. A concentration of the shallow doped region is higher than a concentration of the source and drain region below the shallow doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, comprising:

providing a substrate having a gate stack formed thereon, a source/drain region formed therein and a first dielectric layer formed aside the gate stack and over the source/drain region;

forming an opening through the first dielectric layer, the opening exposing the source/drain region;

performing both a doping step and a pre-amorphous implant step to a surface portion of the source/drain region, wherein the doping step forms a shallow doped region in the source/drain region, a dopant of the doping step has a conductivity type the same with a dopant of the source/drain region, and the pre-amorphous implant step and the doping step are performed with different elements; and forming a silicide layer on a top surface of the shallow doped region after the doping step.

2. The method of claim 1, wherein the doping step is a boron doping step or a phosphor doping step.

3. The method of claim 2, wherein the boron doping step is performed at an energy of about 1 KeV to 2 KeV and a dose of about 2E15 atom/cm$^2$ to 6E15 atom/cm$^2$.

4. The method of claim 2, wherein the phosphor doping step is performed at an energy of about 2 KeV to 5 KeV and a dose of about 2E15 atom/cm$^2$ to 6E15 atom/cm$^2$.

5. The method of claim 1, wherein the doping step is an ion implantation process.

6. The method of claim 1, wherein the doping step is a plasma doping process.

7. The method of claim 6, wherein the plasma doping process is performed by using about 0.1%-10% of a boron-containing gas and about 90%-99.9% of a dilution gas.

8. The method of claim 1, wherein the pre-amorphous implant step is performed before the doping step.

9. The method of claim 1, wherein the pre-amorphous implant step is performed after the doping step.

10. A method of forming a device, comprising:

providing a substrate having a gate stack formed thereon, a source/drain region formed therein and a first dielectric layer formed aside the gate stack and over the source/drain region;

forming an opening through the first dielectric layer, the opening exposing the source/drain region;

performing a doping step to the source/drain region to form a shallow doped region in the source/drain region, wherein a dopant of the doping step has a conductivity type the same with a dopant of the source/drain region, and the shallow doped region has a depth of less than about 8 nm; and forming a silicide layer on a top surface of the shallow doped region after the doping step.

11. The method of claim 10, wherein the doping step is performed at an energy of about 1 KeV to 2 KeV and a dose of about 2E15 atom/cm$^2$ to 6E15 atom/cm$^2$.

12. The method of claim 10, wherein the doping step is an ion implantation process.

13. The method of claim 10, wherein the doping step is a plasma doping process.

14. The method of claim 11, wherein the plasma doping process is performed by using a boron-containing gas and a dilution gas in a ratio of about 0.1%-5% to 95%-99.9%.

15. The method of claim 10, wherein a method of forming the silicide layer comprises:

forming a metal layer on the shallow doped region; and performing an annealing step after forming the metal layer, wherein the annealing step is performed at a temperature of about 850° C. to 1,000° C.

16. A method of forming a device, comprising:

providing a substrate having a gate stack formed thereon, a source/drain region formed therein and a first dielectric layer formed aside the gate stack and over the source/drain region;

forming an opening through the first dielectric layer, the opening exposing the source/drain region;

performing a doping step to the source/drain region to form a shallow doped region in the source/drain region, wherein a concentration of the shallow doped region is higher than a concentration of the source and drain region below the shallow doped region, wherein a dopant of the shallow doped region has a conductivity type the same with a dopant of the source/drain region; and forming a silicide layer on a top surface of the shallow doped region after the doping step.

17. The method of claim 16, wherein the concentration of the shallow doped region is in a range from about 2E20 to 1E21 atom/$cm^3$.

18. The method of claim 16, wherein the doping step is a single step.

19. The method of claim 16, wherein the doping step comprises multiple sub-steps.

20. The method of claim 16, wherein a method of forming the silicide layer comprises:

forming a metal layer on the shallow doped region; and performing an annealing step after forming the metal layer, wherein the annealing step is performed at a temperature of about 850° C. to 1,000° C.

* * * * *